United States Patent
Kamei et al.

(10) Patent No.: US 8,237,205 B2
(45) Date of Patent: Aug. 7, 2012

(54) SEMICONDUCTOR DEVICE AND METHOD FOR FABRICATING THE SAME

(75) Inventors: Masayuki Kamei, Kyoto (JP); Kyouji Yamashita, Kyoto (JP); Daisaku Ikoma, Kyoto (JP)

(73) Assignee: Panasonic Corporation, Osaka (JP)

(*) Notice: Subject to any disclaimer, the term of this patent is extended or adjusted under 35 U.S.C. 154(b) by 169 days.

(21) Appl. No.: 12/538,534

(22) Filed: Aug. 10, 2009

(65) Prior Publication Data

US 2010/0059801 A1 Mar. 11, 2010

(30) Foreign Application Priority Data

Sep. 10, 2008 (JP) .................. 2008-232571

(51) Int. Cl.
H01L 29/76 (2006.01)
(52) U.S. Cl. ............... 257/288; 257/900; 257/E21.205; 257/E21.626; 257/E21.64
(58) Field of Classification Search ........... 257/E21.205, 257/E21.626, E21.64
See application file for complete search history.

(56) References Cited

U.S. PATENT DOCUMENTS

| | | | |
|---|---|---|---|
| 7,176,084 B2 * | 2/2007 | Lee et al. ..................... | 438/257 |
| 7,354,838 B2 | 4/2008 | Kammler et al. | |
| 2005/0191817 A1 | 9/2005 | Komukai et al. | |
| 2005/0205940 A1 * | 9/2005 | Ootsuka ..................... | 257/374 |
| 2007/0034963 A1 | 2/2007 | Sudo | |
| 2007/0037372 A1 | 2/2007 | Kavalieros et al. | |
| 2007/0090465 A1 | 4/2007 | Suzuki et al. | |
| 2008/0067590 A1 * | 3/2008 | Mise et al. ..................... | 257/347 |
| 2008/0128823 A1 | 6/2008 | Takeoka | |
| 2008/0261385 A1 * | 10/2008 | Jawarani et al. .............. | 438/517 |
| 2008/0277736 A1 * | 11/2008 | Nakajima ..................... | 257/377 |
| 2009/0039427 A1 | 2/2009 | Shimizu et al. | |
| 2009/0127627 A1 | 5/2009 | Iwasaki et al. | |

FOREIGN PATENT DOCUMENTS

| | | |
|---|---|---|
| JP | 06-177265 | 6/1994 |
| JP | 10-012868 | 1/1998 |
| JP | 11-345963 | 12/1999 |

(Continued)

OTHER PUBLICATIONS

Japanese Notice of Reasons for Rejection, with English Translation, issued in Japanese Patent Application No. 2008-232571, mailed Nov. 16, 2010.

*Primary Examiner* — Daniel Whalen
(74) *Attorney, Agent, or Firm* — McDermott Will & Emery LLP

(57) ABSTRACT

A semiconductor device includes a gate insulating film formed on a semiconductor region of a first conductivity type; a gate electrode formed on the gate insulating film; an offset spacer formed on a side surface of the gate electrode; an inner sidewall formed on the side surface of the gate electrode with the offset spacer interposed therebetween, and having an L-shaped cross section; and an insulating film formed to cover the gate electrode, the offset spacer, the inner sidewall, and a part of the semiconductor region located laterally outward from the inner sidewall. The offset spacer includes an inner offset spacer formed on the side surface of the gate electrode and an outer offset spacer formed to cover the side surface of the gate electrode and the inner offset spacer. The outer offset spacer is in contact with a top end and outer side surface of the inner offset spacer.

12 Claims, 7 Drawing Sheets

FOREIGN PATENT DOCUMENTS

| | | |
|---|---|---|
| JP | 2004-273559 | 9/2004 |
| JP | 2005-223196 | 8/2005 |
| JP | 2005-244009 | 9/2005 |
| JP | 2005-333155 | 12/2005 |
| JP | 2007-049166 | 2/2007 |
| JP | 2007-123358 | 5/2007 |
| JP | 2009-130009 | 6/2009 |

\* cited by examiner

SEMICONDUCTOR DEVICE AND METHOD FOR FABRICATING THE SAME

CROSS-REFERENCE TO RELATED APPLICATION

This application claims priority to Japanese Patent Application No. 2008-232571 filed on Sep. 10, 2008, the disclosure of which including the specification, the drawings, and the claims is hereby incorporated by reference in its entirety.

BACKGROUND

The present disclosure relates generally to semiconductor devices and methods for fabricating the same, and more particularly relates to a semiconductor device including a MISFET (metal insulator semiconductor field effect transistor) having offset spacers, and a method for fabricating the same.

In recent years, with the increasing degree of integration, increasing functionality, and increasing speed of semiconductor integrated circuit devices, progress has been made in the refinement of MISFETs (hereinafter referred to as MIS transistors). Accordingly, the trend has been to form a gate electrode having a shorter gate length (e.g., in the order of 30 nm) and a thinner gate insulating film (e.g., having a thickness of the order of 2 nm).

A technique has been proposed in which, in order to enhance the driving capability of a MIS transistor, a stressor film is formed after the removal of outer sidewalls so as to be brought closer to a channel region by the width of each of the removed outer sidewalls, and a stress arising from the stressor film is efficiently applied to the channel region along the gate length (see, for example, Japanese Unexamined Patent Application Publication No. 2007-49166). A conventional fabrication method for a semiconductor device will be described hereinafter with reference to FIGS. 6A through 6C. FIGS. 6A through 6C are cross sectional views taken along the gate length and showing essential acts in the conventional fabrication method for a semiconductor device in a sequential order.

First, as shown in FIG. 6A, an isolation region (not shown) is selectively formed in an upper part of a semiconductor substrate 100. Thus, a semiconductor region 100x is formed in the upper part of the semiconductor substrate 100 so as to be surrounded by the isolation region. Thereafter, a well region 101 is formed in the upper part of the semiconductor substrate 100. Then, a gate insulating film 102 and a gate electrode 103 are sequentially formed on the semiconductor region 100x.

Subsequently, offset spacers 104 are formed on the side surfaces of the gate electrode 103, and then extension implantation regions 105a are formed in parts of the semiconductor region 100x located laterally outward from the offset spacers 104. Thereafter, sidewalls 107A composed of inner sidewalls 106 and outer sidewalls 107 are formed on the side surfaces of the gate electrode 103 with the offset spacers 104 interposed between the sidewalls 107A and the gate electrode 103, and then source/drain implantation regions 108a are formed in parts of the semiconductor region 100x located laterally outward from the sidewalls 107A.

Next, as shown in FIG. 6B, conductive impurities contained in the extension implantation regions 105a and the source/drain implantation regions 108a are activated by heat treatment, thereby forming extension regions 105 and source/drain regions 108. Thereafter, the outer sidewalls 107 are removed by wet etching using thermal phosphoric acid.

Next, as shown in FIG. 6C, a first metal silicide film 109 is formed on the gate electrode 103, and second metal silicide films 110 are formed on the source/drain regions 108. Thereafter, a stressor film 111 is formed on the entire surface area of the semiconductor substrate 100.

Subsequently, an interlayer insulating film 112 is formed to cover the stressor film 111, and then a contact hole 113 is formed in the stressor film 111 and the interlayer insulating film 112 to reach the second metal silicide film 110. Thereafter, a barrier metal film 114 is formed on the bottom and side wall of the contact hole 113, and then a conductive film 115 fills the contact hole 113 with the barrier metal film 114 interposed therebetween. In this way, a contact plug 115A is obtained wherein the conductive film 115 fills the contact hole 113 with the barrier metal film 114 interposed therebetween. Thereafter, a wire 116 is formed on the interlayer insulating film 112 so as to be connected with the contact plug 115A.

SUMMARY

However, the conventional fabrication method for a semiconductor device is accompanied by the problems described below.

In the act shown in FIG. 6B, when the outer sidewalls (silicon nitride films) 107 are removed by wet etching using thermal phosphoric acid, upper parts of the offset spacers (silicon nitride films) 104 made of the same material as the outer sidewalls 107 are also removed. Consequently, as shown in FIG. 6B, trenches T are formed between the gate electrode 103 and the inner sidewalls 106, thereby exposing the side surfaces of the gate electrode 103 in the trenches T.

For this reason, in the act shown in FIG. 6C, the first metal silicide film 109 is formed on the gate electrode 103 and the offset spacers 104 to fill the trenches T. More specifically, the formed first metal silicide film 109 is wider than the gate electrode 103.

Therefore, in the act shown in FIG. 6C, in forming the contact plug 115A, a contact plug to be located at a distance x from the associated side surface of the gate electrode 103 is formed at a distance y (y<x) from the associated side surface of the gate electrode 103 so as to be brought closer to the gate electrode 103 as shown in FIG. 7. In this case, a resultant contact plug 215A is in contact with the first metal silicide film 109. This causes shorting between the gate electrode 103 and the contact plug 215A. More specifically, the width of an anti-shorting margin for preventing the shorting between the gate electrode 103 and the contact plug 215A is reduced by the width of a part of the first metal silicide film 109 filling the associated trench T (i.e., the width of the associated offset spacer 104).

As described above, conventionally, simultaneously with the removal of the outer sidewalls 107, the upper parts of the offset spacers 104 are also removed. Thus, as shown in FIG. 6B, the trenches T are formed between the gate electrode 103 and the inner sidewalls 106. Therefore, the first metal silicide film 109 is formed to fill the trenches T, and covers not only the gate electrode 103 but also the offset spacers 104 as shown in FIG. 6C. The width of the anti-shorting margin between the gate electrode 103 and the contact plug 115A is reduced by the width of the associated offset spacer 104.

In view of the above, an object of the present disclosure is to provide a semiconductor device wherein an offset spacer is prevented from being removed, and a method for fabricating the same.

In order to achieve the above object, an example semiconductor device includes: a gate insulating film formed on a semiconductor region of a first conductivity type; a gate electrode formed on the gate insulating film; an offset spacer formed on a side surface of the gate electrode; an inner sidewall formed on the side surface of the gate electrode with the offset spacer interposed between the inner sidewall and the side surface of the gate electrode, and having an L-shaped cross section; and an insulating film formed to cover the gate electrode, the offset spacer, the inner sidewall, and a part of the semiconductor region located laterally outward from the inner sidewall. The offset spacer includes an inner offset spacer formed on the side surface of the gate electrode and an outer offset spacer formed to cover the side surface of the gate electrode and the inner offset spacer, and the outer offset spacer is in contact with a top end and outer side surface of the inner offset spacer.

According to the example semiconductor device, the outer offset spacer is formed to cover the side surface of the gate electrode and the inner offset spacer. In other words, the outer offset spacer is in contact with the top end and outer side surface of the inner offset spacer. This can prevent the inner offset spacer from being removed, resulting in prevention of the removal of the offset spacer.

In the example semiconductor device, the insulating film is preferably in contact with a surface of the inner sidewall.

In the example semiconductor device, the inner offset spacer is preferably made of a silicon nitride film, and the outer offset spacer is preferably made of a silicon oxide film.

Preferably, the example semiconductor device further includes a first metal silicide film formed on the gate electrode.

Thus, as described above, the offset spacer can be prevented from being removed. This prevents a trench from being formed between the gate electrode and the inner sidewall. Consequently, the first metal silicide film is formed on the gate electrode without filling a trench.

Preferably, the example semiconductor device further includes source/drain regions of a second conductivity type formed in the part of the semiconductor region located laterally outward from the inner sidewall.

Preferably, the example semiconductor device further includes: second metal silicide films formed on the source/drain regions; an interlayer insulating film formed on the insulating film; and a contact plug passing through the interlayer insulating film and the insulating film and connected with an associated one of the second metal silicide films.

Thus, as described above, the first metal silicide film is formed on the gate electrode without filling a trench. This can prevent the width of the anti-shorting margin between the gate electrode and the contact plug from being reduced.

In the example semiconductor device, the insulating film is preferably a stressor film inducing, along the gate length, a stress in a channel region of the semiconductor region located under the gate electrode.

It is preferable that in the example semiconductor device, the first conductivity type be p, the second conductivity type be n, and the stress be a tensile stress.

It is preferable that in the example semiconductor device, the first conductivity type be n, the second conductivity type be p, and the stress be a compressive stress.

In the example semiconductor device, the insulating film is preferably made of a silicon nitride film.

In the example semiconductor device, the gate insulating film preferably includes an underlying gate insulating film made of an underlying insulating film formed on the semiconductor region and a high-dielectric-constant gate insulating film made of a high-dielectric-constant insulating film formed on the underlying gate insulating film.

In the example semiconductor device, the gate electrode preferably includes a first conductive film made of a metal film formed on the gate insulating film and a second conductive film made of a silicon film formed on the first conductive film.

In order to achieve the above object, an example method for fabricating a semiconductor device includes acts of: (a) forming a gate insulating film on a semiconductor region of a first conductivity type; (b) forming a gate electrode on the gate insulating film; (c) forming an offset spacer on a side surface of the gate electrode, the offset spacer including an inner offset spacer and an outer offset spacer; (d) forming an inner sidewall having an L-shaped cross section on the side surface of the gate electrode with the offset spacer interposed between the inner sidewall and the side surface of the gate electrode; and (e) forming an insulating film to cover the gate electrode, the offset spacer, the inner sidewall, and a part of the semiconductor region located laterally outward from the inner sidewall. The act (c) includes acts of: (c1) forming the inner offset spacer on the side surface of the gate electrode, a top end of the inner offset spacer being lower than a top surface of the gate electrode; and (c2) forming the outer offset spacer to cover the side surface of the gate electrode and the inner offset spacer, and in the act (c2), the outer offset spacer is in contact with a top end and outer side surface of the inner offset spacer.

According to the example method, the outer offset spacer is formed to cover the side surface of the gate electrode and the inner offset spacer. In other words, the outer offset spacer is in contact with the top end and outer side surface of the inner offset spacer. This can prevent the inner offset spacer from being removed, resulting in prevention of the removal of the offset spacer.

In the example method, in the act (e), the insulating film is preferably in contact with a surface of the inner sidewall.

In the example method, the act (d) preferably includes acts of: (d1) forming a sidewall on the side surface of the gate electrode with the offset spacer interposed between the sidewall and the side surface of the gate electrode, the sidewall including the inner sidewall and an outer sidewall; (d2) forming source/drain regions of a second conductivity type in a part of the semiconductor region located laterally outward from the sidewall; and (d3) after the act (d2), removing the outer sidewall and leaving the inner sidewall.

Thus, as described above, the outer offset spacer is in contact with the top end and outer side surface of the inner offset spacer. This prevents the inner offset spacer made of the same material as the outer sidewall from being removed simultaneously with the removal of the outer sidewall.

In the example method, the inner offset spacer and the outer sidewall are preferably made of silicon nitride films.

Preferably, the example method further includes an act of (f) after the act (d) and before the act (e), forming a first metal silicide film on the gate electrode and forming second metal silicide films on the source/drain regions.

Thus, as described above, the offset spacer can be prevented from being removed simultaneously with the removal of the outer sidewall. This prevents a trench from being formed between the gate electrode and the inner sidewall. Consequently, the first metal silicide film is formed on the gate electrode without filling a trench.

Preferably, the example method further includes acts of: (g) after the act (e), forming an interlayer insulating film on the insulating film; and (h) forming a contact plug in the insulating film and the interlayer insulating film so as to be connected with an associated one of the second metal silicide films.

Thus, as described above, the first metal silicide film can be formed on the gate electrode without filling a trench. This can prevent the width of the anti-shorting margin between the gate electrode and the contact plug from being reduced.

As described above, according to the example semiconductor device and the example fabrication method for the same, the outer offset spacer is formed in contact with the top end and outer side surface of the inner offset spacer. This contact can prevent the inner offset spacer from being removed, for example, simultaneously with the removal of the outer sidewall, resulting in prevention of the removal of the offset spacer. This prevention prevents a trench from being formed between the gate electrode and the inner sidewall. Consequently, the first metal silicide film can be formed on the gate electrode without filling a trench. This can prevent the width of the anti-shorting margin between the gate electrode and the contact plug from being reduced.

DETAILED DESCRIPTION

An example method for fabricating a semiconductor device will be described hereinafter with reference to FIGS. 1A through 4C. FIGS. 1A through 4C are cross sectional views taken along the gate length and showing essential acts in an example method for fabricating a semiconductor device in a sequential order. In this example embodiment, the case where a MIS transistor formed on a semiconductor substrate is of an N conductivity type will be described as a specific example.

Figure 1A:
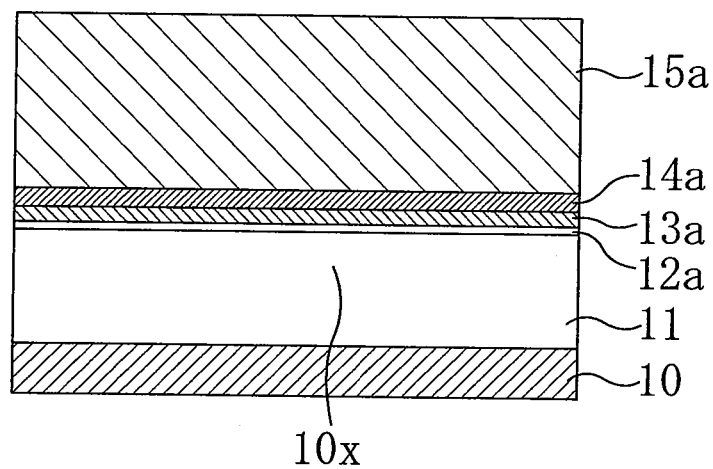
FIGS. 1A through 1C are cross sectional views taken along the gate length and showing essential acts in an example method for fabricating a semiconductor device in a sequential order.

First, as shown in FIG. 1A, an isolation region (not shown) is selectively formed in an upper part of a semiconductor substrate 10 made of, for example, p-type silicon. Thus, a semiconductor region 10x is formed in the upper part of the semiconductor substrate 10 so as to be surrounded by the isolation region. Thereafter, p-type impurity ions, such as boron (B) ions, are implanted into the semiconductor substrate 10, for example, at a dose of $1\times10^{13}/cm^2$. In this way, a p-type well region 11 is formed in the upper part of the semiconductor substrate 10.

Subsequently, for example, a 0.5-2 nm-thick underlying insulating film 12a made of a silicon oxide film, a silicon nitride film, or a combination of a silicon oxide film and a silicon nitride film is formed on the semiconductor substrate 10. Examples of processes for forming the underlying insulating film 12a include the following processes. First, for example, an upper part of the semiconductor substrate 10 is oxidized by an in situ steam generation (ISSG) process, a rapid thermal oxidation (RTO) process or an oxidation furnace, thereby forming an underlying insulating film made of a silicon oxide film on the semiconductor substrate 10. Second, for example, a silicon oxide film is formed on the semiconductor substrate 10 by the ISSG process, the RTO process, or an oxidation furnace, and then an upper part of the silicon oxide film is nitrided by a decoupled plasma nitridation (DPN) process. In this way, an underlying insulating film is configured so that a silicon oxide film and a silicon nitride film are sequentially stacked, and is formed on the semiconductor substrate 10. Third, for example, a silicon oxide film is formed on the semiconductor substrate 10 by the ISSG process, the RTO process, or an oxidation furnace, and then the entire silicon oxide film is nitrided by the DPN process. In this way, an underlying insulating film made of a silicon nitride film is formed on the semiconductor substrate 10.

Thereafter, for example, a 1-3 nm-thick high-dielectric-constant insulating film 13a is formed on the underlying insulating film 12a. Examples of materials of the high-dielectric-constant insulating film 13a include a silicon nitride film (SiN), a hafnium silicon oxide film (HfSiO), a hafnium silicon nitride film (HfSiN), a hafnium silicon oxynitride film (HfSiON), a hafnium dioxide film ($HfO_2$), a hafnium aluminate film (HfAlO), a lanthanum aluminate film ($LaAlO_3$), a dilutetium trioxide film ($Lu_2O_3$), a dipraseodymium trioxide film ($Pr_2O_3$), a zirconium dioxide film ($ZrO_2$), a ditantalum pentaoxide film ($Ta_2O_5$), a didysprosium trioxide film ($Dy_2O_3$), or a digadolinium trioxide film ($Gd_2O_3$). Furthermore, examples of processes for forming the high-dielectric-constant insulating film 13a include atomic layer deposition (ALD) or metal organic chemical vapor deposition (MOCVD).

Thereafter, for example, a 4-15 nm-thick metal film 14a made of titanium nitride (TiN) is formed on the high-dielectric-constant insulating film 13a. Then, for example, an 80-150 nm-thick silicon film 15a made of a polysilicon film is formed on the metal film 14a. Thereafter, n-type impurity ions, such as phosphorus (P) ions or arsenic (As) ions, are implanted into the silicon film 15a, for example, at a dose of $1\times10^{15}/cm^2$.

Figure 1B:
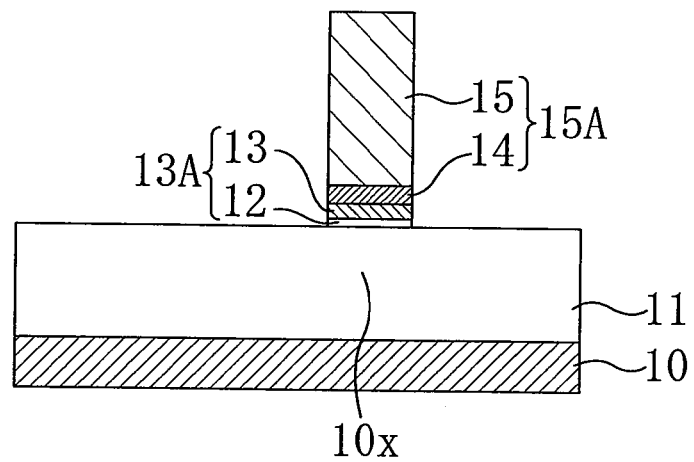

Next, as shown in FIG. 1B, a resist film (not shown) having the same width as a gate electrode to be formed is formed on the silicon film 15a, and then the silicon film 15a, the metal film 14a, and the high-dielectric-constant insulating film 13a are sequentially patterned by dry etching using the resist film as a mask, thereby exposing the top surface of the underlying insulating film 12a. In this way, a high-dielectric-constant gate insulating film 13 made of the high-dielectric-constant insulating film, a first conductive film 14 made of the metal film, and a second conductive film 15 made of the silicon film are sequentially formed on the underlying insulating film 12a.

Subsequently, the resist film is removed, and then the underlying insulating film 12a is partially removed by wet etching or dry etching using the second conductive film 15. as a mask, thereby forming an underlying gate insulating film 12 made of the underlying insulating film.

In the above-described manner, a gate insulating film 13A composed of the underlying gate insulating film 12 and the high-dielectric-constant gate insulating film 13, and a gate electrode 15A composed of the first conductive film 14 and the second conductive film 15 are sequentially formed on the semiconductor region 10x.

Figure 1C:
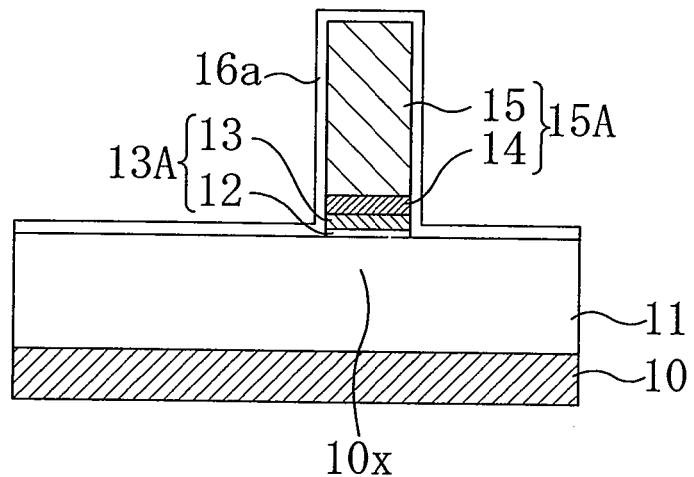

Next, as shown in FIG. 1C, for example, a 1-3 nm-thick first insulating film 16a made of a silicon nitride film is formed to cover the semiconductor substrate 10 and the gate electrode 15A.

Figure 2A:
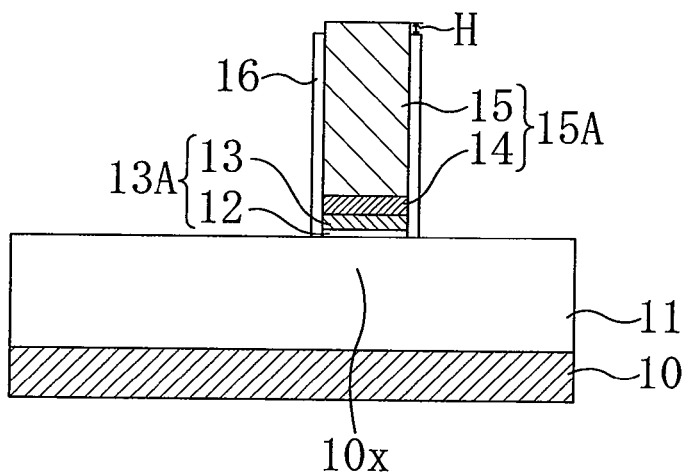
FIGS. 2A through 2C are cross sectional views taken along the gate length and showing other essential acts in the example method for fabricating a semiconductor device in a sequential order.

Next, as shown in FIG. 2A, parts of the first insulating film 16a located on the top surface of the gate electrode 15A and the semiconductor substrate 10 are removed by entire-surface dry etching, and the other parts of the first insulating film 16a are left on both side surfaces of the gate electrode 15A. Subsequently, upper parts of the remaining parts of the first insulating film 16a are removed by entire-surface dry etching. In this way, 1-3 nm-wide inner offset spacers 16 made of the first insulating film (silicon nitride film) are formed on the side surfaces of the gate electrode 15A. The level of the top end of each of the inner offset spacers 16 is, for example, 5 through 50 nm (see the height H in FIG. 2A) lower than that of the top surface of the gate electrode 15A. Here, the entire-surface dry etching means dry etching to which the entire surface of a film to be etched is subjected without a resist film being formed on the film to be etched.

Figure 2B:
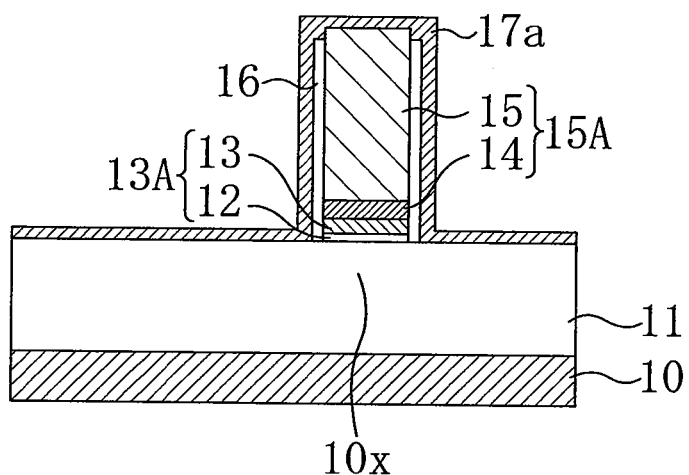

Next, as shown in FIG. 2B, for example, a 1-3 nm-thick second insulating film 17a made of a silicon oxide film is formed to cover the semiconductor substrate 10, the gate electrode 15A, and the inner offset spacers 16.

Figure 2C:
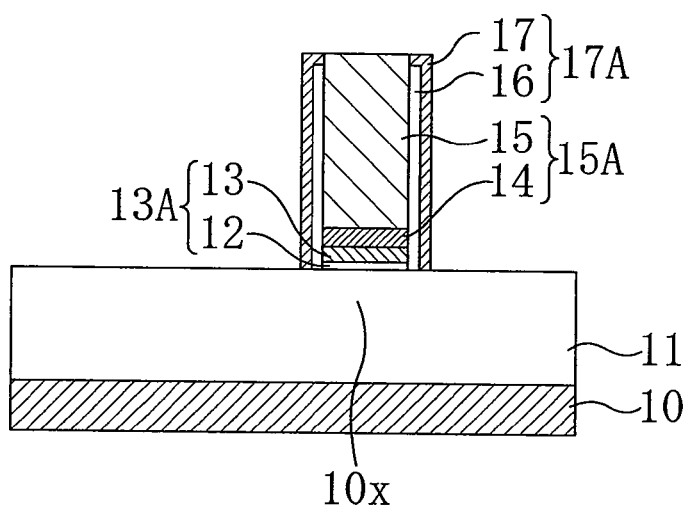

Next, as shown in FIG. 2C, parts of the second insulating film 17a located on the top surface of the gate electrode 15A and the semiconductor substrate 10 are removed by the entire-surface dry etching. Thus, 1-3 nm-wide outer offset spacers 17 made of the second insulating film (silicon oxide film) are formed to cover the side surfaces of the gate electrode 15A and the inner offset spacers 16. In this way, as shown in FIG. 2C, the outer offset spacers 17 are in contact with the top ends and outer side surfaces of the inner offset spacers 16.

In the above-described manner, offset spacers 17A composed of the inner offset spacers 16 and the outer offset spacers 17 are formed on the side surfaces of the gate electrode 15A.

Figure 3A:
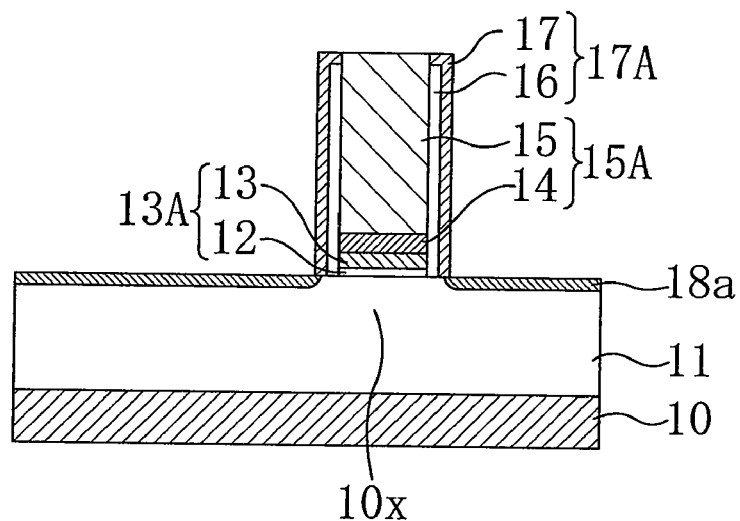
FIGS. 3A through 3C are cross sectional views taken along the gate length and showing still other essential acts in the example method for fabricating a semiconductor device in a sequential order.

Next, as shown in FIG. 3A, n-type impurity ions, such as As ions, are implanted into the semiconductor region 10x at a dose of, for example, $1 \times 10^{15}/cm^2$. In this way, n-type extension implantation regions 18a are formed in parts of the semiconductor region 10x located laterally outward from the offset spacers 17A in a self-aligned manner.

Figure 3B:
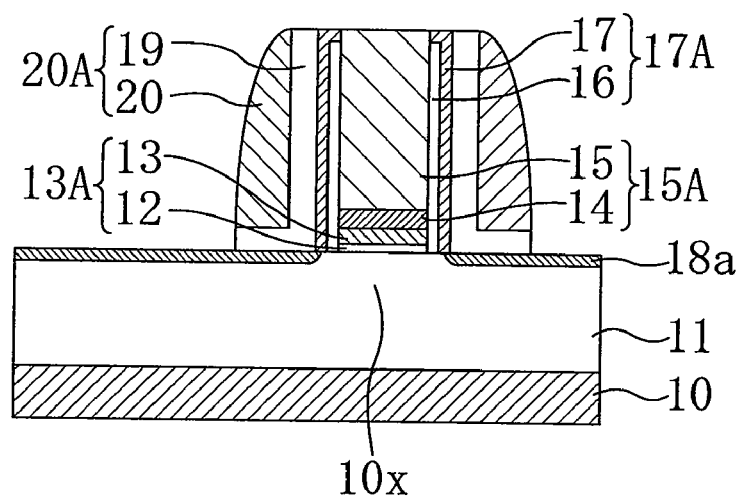

Next, as shown in FIG. 3B, for example, a 10-30 nm-thick silicon oxide film and a 30-50 nm-thick silicon nitride film are sequentially formed on the entire surface area of the semiconductor substrate 10, then inner sidewalls 19 each having an L-shaped cross section and made of the silicon oxide film are formed, by entire-surface dry etching, on the side surfaces of the gate electrode 15A with the offset spacers 17A interposed therebetween, and outer sidewalls 20 made of the silicon nitride film are formed on the inner sidewalls 19 by entire-surface dry etching.

In the above-described manner, sidewalls 20A composed of the inner sidewalls 19 and the outer sidewalls 20 are formed on the side surfaces of the gate electrode 15A with the offset spacers 17A interposed therebetween.

Figure 3C:
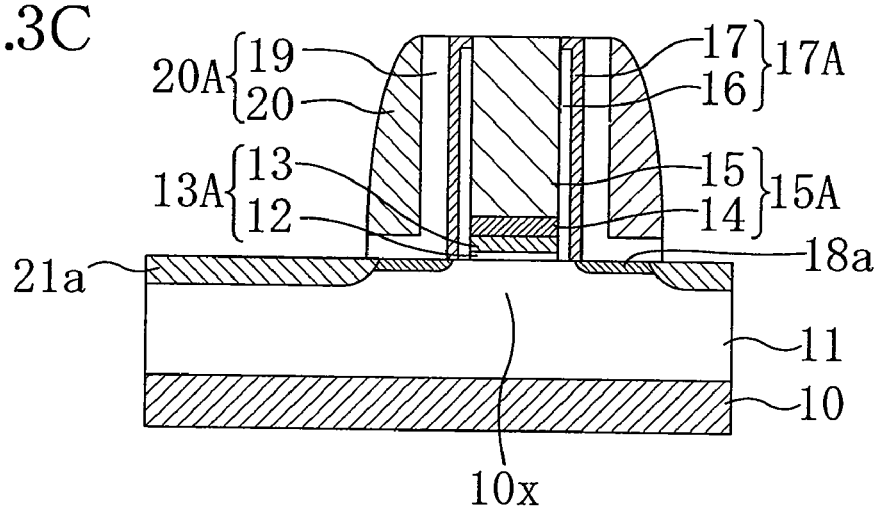

Next, as shown in FIG. 3C, n-type impurity ions, such as As ions, are implanted into the semiconductor region 10x at a dose of, for example, $1 \times 10^{15}/cm^2$. In this way, n-type source/drain implantation regions 21a are formed in parts of the semiconductor region 10x located laterally outward from the sidewalls 20A in a self-aligned manner. The depth to which the n-type impurity ions are implanted to form the n-type source/drain implantation regions 21a is greater than that to which the n-type impurity ions are implanted to form the n-type extension implantation regions 18a.

Figure 4A:
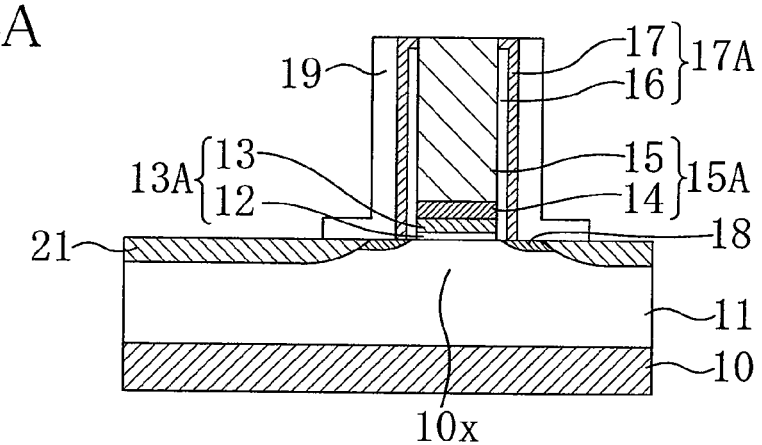
FIGS. 4A through 4C are cross sectional views taken along the gate length and showing yet other essential acts in the example method for fabricating a semiconductor device in a sequential order.

Next, as shown in FIG. 4A, the n-type impurities contained in the n-type extension implantation regions 18a and the n-type source/drain implantation regions 21a are activated by heat treatment, thereby forming n-type extension regions 18 and the n-type source/drain regions 21. Thereafter, the outer sidewalls (silicon nitride films) 20 are removed by wet etching using thermal phosphoric acid exhibiting good selectivity to silicon oxide films (the inner sidewalls 19), and thus the inner sidewalls 19 are left.

Figure 4B:
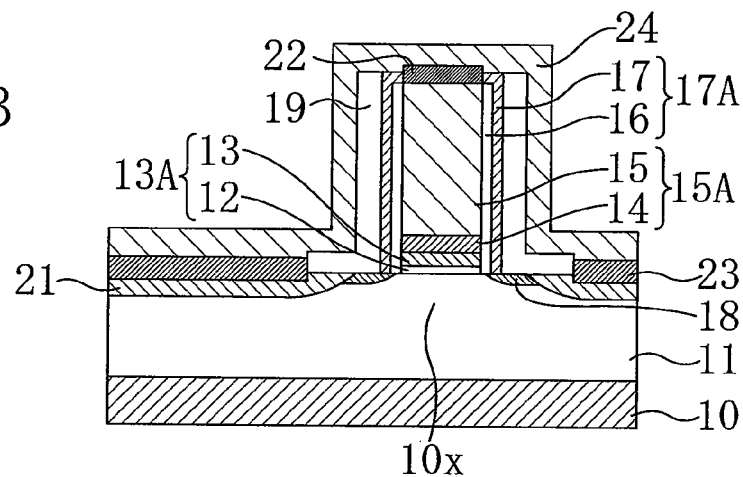

Next, as shown in FIG. 4B, for example, a 10-20 nm-thick metal film (not shown) which is to be silicided and is made of nickel (Ni) (hereinafter referred to as a "silicidation metal film") is formed on the entire surface area of the semiconductor substrate 10, for example, by sputtering. Thereafter, a first heat treatment allows silicon in each of the second conductive film 15 of the gate electrode 15A and the n-type source/drain regions 21 to react with nickel in the silicidation metal film. In this way, a 20-40 nm-thick first metal silicide film 22 made of nickel silicide (NiSi) is formed on the second conductive film 15 of the gate electrode 15A, and 20-40 nm-thick second metal silicide films 23 made of nickel silicide (NiSi) are formed on the n-type source/drain regions 21. Thereafter, unreacted parts of the silicidation metal film left on the offset spacers 17A, the inner sidewalls 19 and other components are removed. Then, a second heat treatment at a temperature higher than that in the first heat treatment stabilizes the silicide composition ratio in each of the first and second metal silicide films 22 and 23.

Thereafter, an insulating film 24 made of, for example, a silicon nitride film is formed to cover the first metal silicide film 22 on the gate electrode 15A, the offset spacers 17A, the inner sidewalls 19, and the second metal silicide films 23 on parts of the semiconductor region 10x located laterally outward from the inner sidewalls 19 (i.e., the n-type source/drain regions 21). Thus, as shown in FIG. 4B, the insulating film 24 is in contact with the surfaces of the inner sidewalls 19 each having an L-shaped cross section (i.e., the top and outer side surfaces of the inner sidewalls 19, or equivalently, surfaces of the inner sidewalls 19 other than the inner side and bottom surfaces thereof). In this example embodiment, a stressor film inducing, along the gate length, a tensile stress in the channel region of the semiconductor region 10x located under the gate electrode 15A is used as the insulating film 24.

Figure 4C:
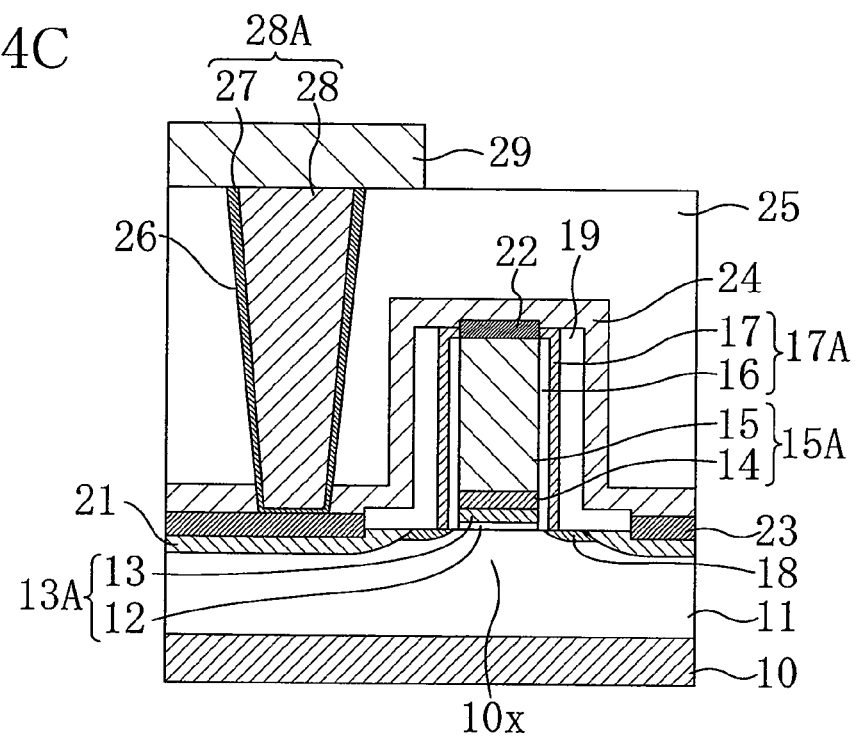

Next, as shown in FIG. 4C, an interlayer insulating film 25 made of, for example, a silicon oxide film is formed on the insulating film 24, and then the surface of the interlayer insulating film 25 is planarized, for example, by CMP (chemical mechanical polishing). Thereafter, a contact hole 26 is formed in the insulating film 24 and the interlayer insulating film 25 to reach the second metal silicide film 23. Subsequently, for example, a 3-10 nm-thick barrier metal film 27 made of titanium nitride (TiN) is formed on the bottom and side wall of the contact hole 26, and then a conductive film 28 made of, for example, tungsten (W) fills the contact hole 26 with the barrier metal film 27 interposed therebetween. In this way, a contact plug 28A is obtained wherein the conductive film 28 fills the contact hole 26 with the barrier metal film 27 interposed therebetween.

In the above-described manner, the contact plug 28A is formed in the insulating film 24 and the interlayer insulating film 25 so as to be connected with the second metal silicide film 23.

Thereafter, a metal film that is to be used as a wire and is made of, for example, copper (Cu), or aluminum (Al), is formed on the interlayer insulating film 25, and then the metal film is patterned to take the shape of a wire. In this way, a wire 29 is formed on the interlayer insulating film 25 so as to be connected with the contact plug 28A.

In the above-described manner, an example semiconductor device can be fabricated.

The structure of the example semiconductor device will be described hereinafter with reference to FIG. 4C.

The example semiconductor device includes an N-type MIS transistor formed on the semiconductor substrate 10.

As shown in FIG. 4C, the example semiconductor device includes a semiconductor region 10x surrounded by an isolation region (not shown) of the semiconductor substrate 10, a p-type well region 11 formed in an upper part of the semiconductor substrate 10, a gate insulating film 13A formed on the semiconductor region 10x, a gate electrode 15A formed on the gate insulating film 13A, offset spacers 17A formed on both side surfaces of the gate electrode 15A, inner sidewalls 19 formed on the side surfaces of the gate electrode 15A with the offset spacers 17A interposed therebetween, and each having an L-shaped cross section, n-type extension regions 18 formed in parts of the semiconductor region 10x located laterally outward from the offset spacers 17A, n-type source/drain regions 21 formed in parts of the semiconductor region 10x located laterally outward from the inner sidewalls 19, a first metal silicide film 22 formed on a second conductive film 15 of the gate electrode 15A, second metal silicide films 23 formed on the n-type source/drain regions 21, an insulating film 24 formed to cover the first metal silicide film 22 on the gate electrode 15A, the offset spacers 17A, the inner sidewalls 19, and the second metal silicide films 23 on parts of the semiconductor region 10x located laterally outward from the inner sidewalls 19 (i.e., the n-type source/drain regions 21), an interlayer insulating film 25 formed on the insulating film 24, a contact plug 28A that is formed to pass through the interlayer insulating film 25 and the insulating film 24 and is connected with the associated second metal silicide film 23, and a wire 29 formed on the interlayer insulating film 25 so as to be connected with the contact plug 28A.

Here, as shown in FIG. 4C, the gate insulating film 13A includes an underlying gate insulating film 12 made of an underlying insulating film formed on the semiconductor region 10x and a high-dielectric-constant gate insulating film 13 made of a high-dielectric-constant insulating film formed on the underlying gate insulating film 12.

As shown in FIG. 4C, the gate electrode 15A includes a first conductive film 14 made of a metal film formed on the gate insulating film 13A and a second conductive film 15 made of a silicon film formed on the first conductive film 14.

As shown in FIG. 4C, the offset spacers 17A include inner offset spacers 16 formed on the side surfaces of the gate electrode 15A and made of a silicon nitride film and outer offset spacers 17 formed to cover the side surfaces of the gate electrode 15A and the inner offset spacers 16 and made of a silicon oxide film. More specifically, the outer offset spacers 17 are in contact with the top ends and outer side surfaces of the inner offset spacers 16.

The insulating film 24 is a stressor film inducing, along the gate length, a tensile stress in a channel region of the semiconductor region 10x located under the gate electrode 15A. As shown in FIG. 4C, the insulating film 24 is in contact with the surfaces of the inner sidewalls 19 each having an L-shaped cross section (i.e., the top and outer side surfaces of the inner sidewalls 19).

As described above, structural features of the example semiconductor device are as follows.

In this example embodiment, as shown in FIG. 4C, the offset spacers 17A include the inner offset spacers 16 and the outer offset spacers 17 being in contact with the top ends and outer side surfaces of the inner offset spacers 16. In other words, the offset spacers 17A are configured as multilayer structures including the inner offset spacers 16 and the outer offset spacers 17. In contrast, an offset spacer has conventionally been configured as a single-layer structure (see the offset spacers 104 in FIG. 6C).

Figure 6A:
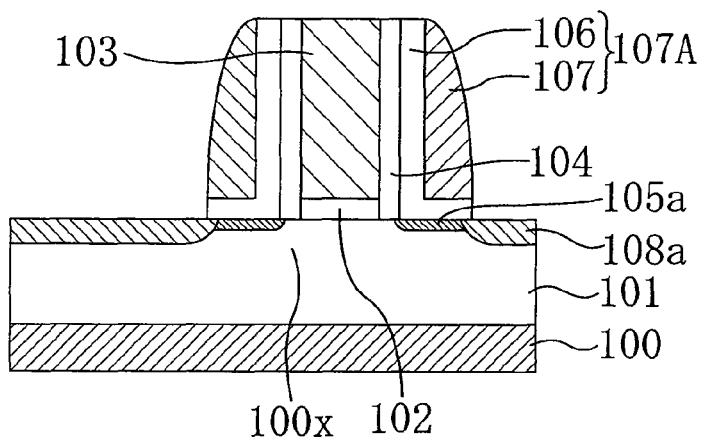
FIGS. 6A through 6C are cross-sectional views taken along the gate length and showing acts in a conventional method for fabricating a semiconductor device in a sequential order.
Figure 6B:
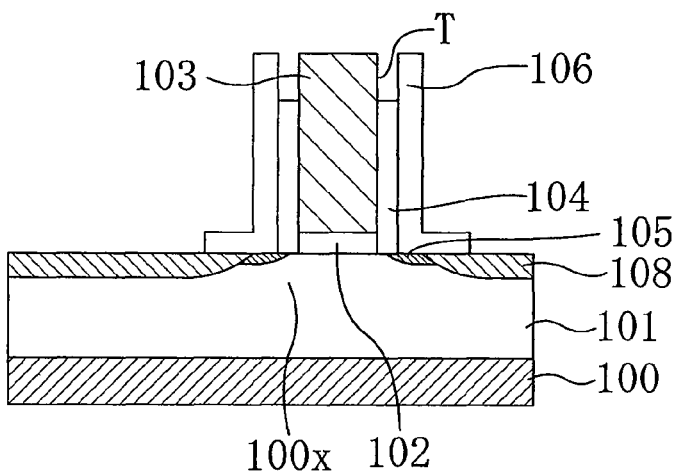
Figure 6C:
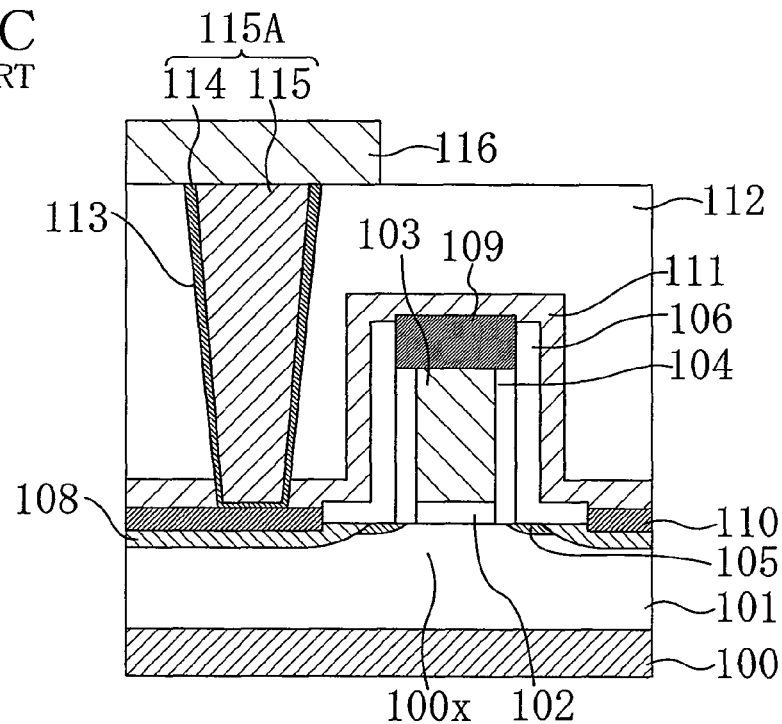
Figure 7:
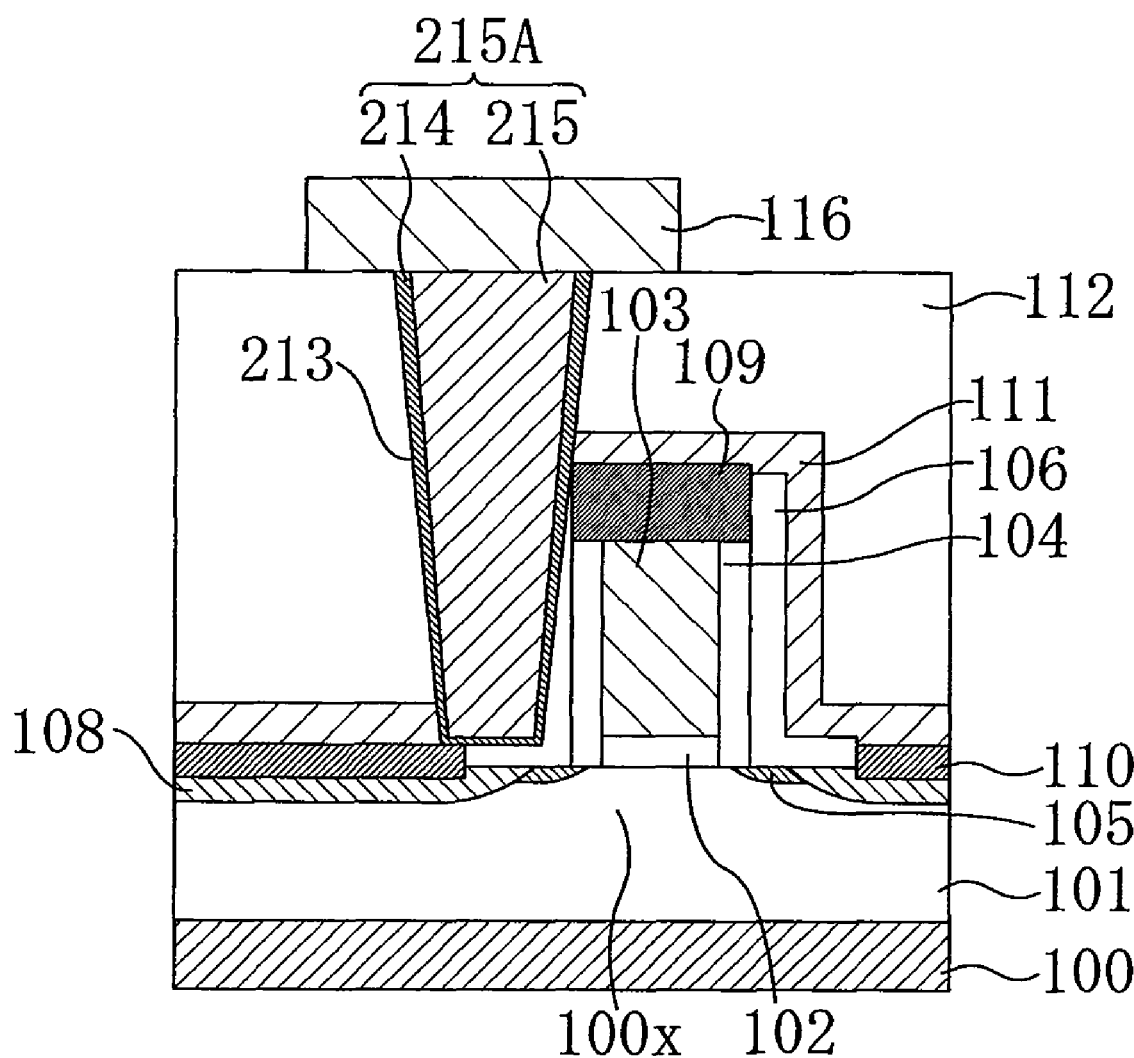
FIG. 7 is a cross sectional view showing the structure of a conventional semiconductor device along the gate length.

In this example embodiment, as shown in FIG. 4C, the first metal silicide film 22 is formed on the second conductive film 15 of the gate electrode 15A. On the other hand, in the conventional art, as shown in FIG. 6C, the first metal silicide film 109 is formed to cover not only the gate electrode 103 but also the offset spacers 104. In view of the above, in this example embodiment, the insulating film (stressor film) 24 is formed to cover the first metal silicide film 22 on the gate electrode 15A, the offset spacers 17A, the inner sidewalls 19, and the second metal silicide films 23 on the n-type source/drain regions 21 as shown in FIG. 4C. In contrast, in the conventional art, the stressor film 111 is formed to cover the first metal silicide film 109 covering the gate electrode 103 and the offset spacers 104, the inner sidewalls 106, and the second metal silicide films 110 on the source/drain regions 108 as shown in FIG. 6C.

According to this example embodiment, the outer offset spacers (silicon oxide films) 17 are in contact with the top ends and outer side surfaces of the inner offset spacers 16. Therefore, in the act shown in FIG. 4A, the inner offset spacers (silicon nitride films) 16 are not removed simultaneously with the removal of the outer sidewalls (silicon nitride films) 20 by wet etching using thermal phosphoric acid. This can prevent the offset spacers 17A from being removed. Consequently, no trench (see the trenches T in FIG. 6B) is formed between the gate electrode 15A and the inner sidewalls 19.

Figure 5:
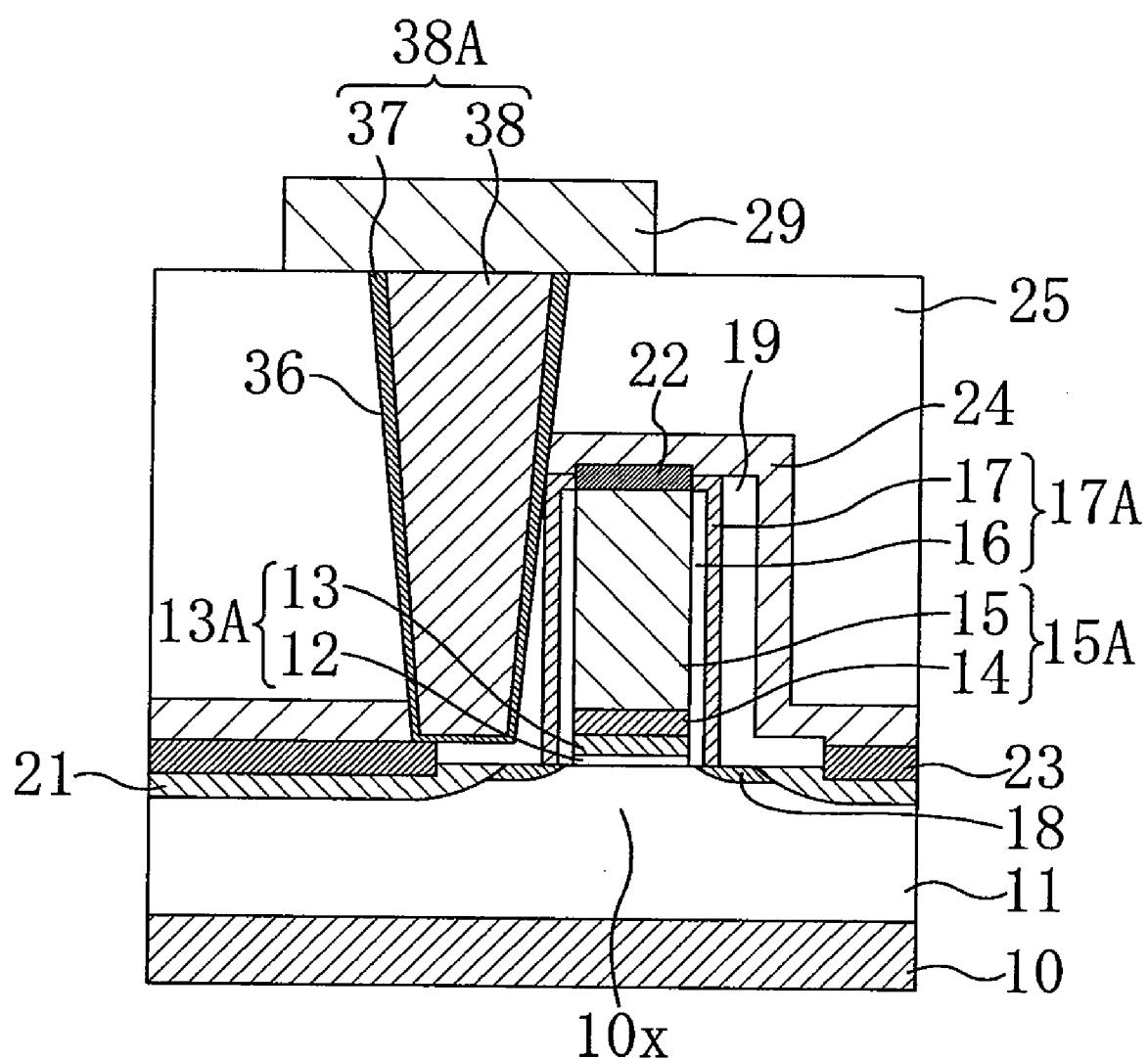
FIG. 5 is a cross sectional view taken along the gate length and showing the structure of an example semiconductor device.

In view of the above, in the act shown in FIG. 4B, in order to form the first metal silicide film 22, a silicidation metal film (not shown) is formed in contact with only the top surface of the second conductive film 15 of the gate electrode 15A. Thus, the first metal silicide film 22 can be formed on the second conductive film 15 of the gate electrode 15A without filling trenches. Therefore, even if, in the act shown in FIG. 4C, in forming the contact plug 28A, a contact plug is misaligned so as to be formed near the gate electrode 15A (more specifically, for example, even if, in forming a contact plug planned to be formed at the distance x from the associated side surface of the gate electrode 15A, a contact plug 38A is formed at the distance y (y<x) from the associated side surface of the gate electrode 15A and misaligned so as to be brought closer to the gate electrode 15A as shown in FIG. 5), the contact plug 38A is not in contact with the first metal silicide film 22. This can prevent shorting between the gate electrode 15A and the contact plug 38A.

In view of the above, the width of the anti-shorting margin between the gate electrode 15A and the contact plug 28A can be prevented from being reduced by the width of the associated offset spacer as in the conventional art.

Furthermore, after the removal of the outer sidewalls 20 as shown in FIG. 4A, the insulating film (stressor film) 24 is formed in contact with the surfaces of the inner sidewalls 19 as shown in FIG. 4B. Therefore, the insulating film 24 can be formed so as to be brought closer to the channel region by the width of the removed outer sidewalls 20. Hence, a tensile stress induced by the insulating film 24 can be efficiently applied to the channel region along the gate length. This can effectively enhance the driving capability of the N-type MIS transistor.

Although in this example embodiment the case where a MIS transistor formed on a semiconductor substrate is of an N conductivity type was described as a specific example, the present disclosure is not limited to this case. For example, also in the case where such a MIS transistor is of a P conductivity type (i.e., the case where the conductivity type of the p-type well region 11 of this example embodiment is changed to n and the conductivity type of each of the n-type extension regions 18 and the n-type source/drain regions 21 is changed to p), advantages similar to those of this example embodiment can be provided. However, in this case, if a stressor film is used as an insulating film, a stressor film inducing a compressive stress in the channel region along the gate length is used instead of the stressor film of this example embodiment inducing a tensile stress in the channel region along the gate length.

Furthermore, although in this example embodiment the case where a stressor film is used as the insulating film 24 was described as a specific example, the present disclosure is not limited to this case.

Moreover, although in this example embodiment the case where the gate electrode 15A composed of the first conductive film 14 made of a metal film and the second conductive film 15 made of a silicon film is formed on the gate insulating film 13A composed of the underlying gate insulating film 12 and the high-dielectric-constant gate insulating film 13 was described as a specific example, the present disclosure is not limited to this case. For example, also in the case where a gate electrode made of a polysilicon film is formed on a gate insulating film made of a silicon oxide film or a silicon nitride film, advantages similar to those of this example embodiment can be provided.

Additionally, although in this example embodiment the case where titanium nitride (TiN) is used as a material of the metal film 14a partially forming the first conductive film 14 was described, the present disclosure is not limited to this case. For example, also in the case where, instead of titanium nitride, tantalum nitride (TaN) is used as a material of the metal film 14a, advantages similar to those of this example embodiment can be provided.

Furthermore, although in this example embodiment the case where the first and second metal silicide films 22 and 23 made of nickel silicide (NiSi) are formed using nickel as a material of the silicidation metal film was described as a specific example, the present disclosure is not limited to this case. For example, instead of nickel, cobalt may be used as a material of the silicidation metal film to form the first and second metal silicide films made of cobalt disilicide ($CoSi_2$).

As described above, in the present disclosure, offset spacers can be prevented from being removed simultaneously with the removal of outer sidewalls. The present disclosure is therefore useful for a semiconductor device including a MIS transistor having offset spacers and a method for fabricating the same.

What is claimed is:

1. A semiconductor device comprising:
   a gate insulating film formed on a semiconductor region of a first conductivity type;
   a gate electrode formed on the gate insulating film;
   an offset spacer formed on a side surface of the gate electrode;
   an inner sidewall formed on the side surface of the gate electrode with the offset spacer interposed between the inner sidewall and the side surface of the gate electrode, and having an L-shaped cross section; and
   an insulating film formed to cover the gate electrode, the offset spacer, the inner sidewall, and a part of the semiconductor region located laterally outward from the inner sidewall,
   wherein the offset spacer includes an inner offset spacer formed on and in contact with the side surface of the gate electrode and having a rectangular cross section, and an outer offset spacer formed to cover the side surface of the gate electrode and the inner offset spacer,
   the outer offset spacer is in contact with a top end surface and an outer side surface of the inner offset spacer, and
   the inner offset spacer is formed as a single layer.

2. The semiconductor device of claim 1, wherein the insulating film is in contact with a surface of the inner sidewall.

3. The semiconductor device of claim 1, wherein
   the inner offset spacer is made of a silicon nitride film, and
   the outer offset spacer is made of a silicon oxide film.

4. The semiconductor device of claim 1 further comprising a first metal silicide film formed on the gate electrode.

5. The semiconductor device of claim 1 further comprising source/drain regions of a second conductivity type formed in the part of the semiconductor region located laterally outward from the inner sidewall.

6. The semiconductor device of claim 5 further comprising:
   second metal silicide films formed on the source/drain regions;
   an interlayer insulating film formed on the insulating film; and
   a contact plug passing through the interlayer insulating film and the insulating film and connected with an associated one of the second metal silicide films.

7. The semiconductor device of claim 5, wherein the insulating film is a stressor film inducing, along the gate length, a stress in a channel region of the semiconductor region located under the gate electrode.

8. The semiconductor device of claim 7, wherein
   the first conductivity type is p,
   the second conductivity type is n, and
   the stress is a tensile stress.

9. The semiconductor device of claim 7, wherein
   the first conductivity type is n,
   the second conductivity type is p, and
   the stress is a compressive stress.

10. The semiconductor device of claim 1, wherein the insulating film is made of a silicon nitride film.

11. The semiconductor device of claim 1, wherein the gate insulating film includes an underlying gate insulating film made of an underlying insulating film formed on the semiconductor region and a high-dielectric-constant gate insulating film made of a high-dielectric-constant insulating film formed on the underlying gate insulating film.

12. The semiconductor device of claim 1, wherein the gate electrode includes a first conductive film made of a metal film formed on the gate insulating film and a second conductive film made of a silicon film formed on the first conductive film.

* * * * *